United States Patent
Hsu et al.

(10) Patent No.: US 7,265,696 B2
(45) Date of Patent: Sep. 4, 2007

(54) METHODS AND APPARATUS FOR TESTING AN INTEGRATED CIRCUIT

(75) Inventors: Louis Lu-Chen Hsu, Fishkill, NY (US); Jack Allan Mandelman, Flat Rock, NC (US); Joseph O. Marsh, Poughkeepsie, NY (US); Steven J. Zier, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/272,589

(22) Filed: Nov. 10, 2005

(65) Prior Publication Data

US 2007/0103350 A1  May 10, 2007

(51) Int. Cl.
*H03M 1/10* (2006.01)
(52) U.S. Cl. .................... 341/120; 341/144
(58) Field of Classification Search ............ 341/155, 341/118, 120, 121, 144; 257/678, 686, 724; 365/201; 324/760; 385/201
See application file for complete search history.

(56) References Cited

U.S. PATENT DOCUMENTS

| | | | | |
|---|---|---|---|---|
| 6,426,904 B2* | 7/2002 | Barth et al. | ................. | 365/201 |
| 6,442,724 B1* | 8/2002 | Augarten | .................... | 714/738 |
| 6,586,921 B1* | 7/2003 | Sunter | ..................... | 324/76.11 |
| 6,633,502 B2* | 10/2003 | Iwasaki | ..................... | 365/201 |
| 6,717,222 B2* | 4/2004 | Zhang | ........................ | 257/390 |
| 7,075,325 B2* | 7/2006 | Park et al. | .................. | 324/765 |
| 2002/0199142 A1* | 12/2002 | Gefen | ........................ | 714/724 |
| 2005/0236703 A1* | 10/2005 | Kazi et al. | ................... | 257/678 |

* cited by examiner

*Primary Examiner*—Peguy JeanPierre
(74) *Attorney, Agent, or Firm*—Dugan & Dugan, PC

(57) ABSTRACT

In a first aspect, a method of testing an analog circuit is provided. The method includes (1) providing the analog circuit with a screening circuit adapted to cause the analog circuit to function like a logic gate during a test; and (2) applying digital signals to the analog circuit to test the analog circuit at a wafer level so as to detect a defect in one or more components of the analog circuit. Numerous other aspects are provided.

24 Claims, 9 Drawing Sheets

METHODS AND APPARATUS FOR TESTING AN INTEGRATED CIRCUIT

FIELD OF THE INVENTION

The present invention relates generally to semiconductor devices, and more particularly to methods and apparatus for testing an integrated circuit.

BACKGROUND

Conventional methods of testing an analog circuit may be performed at a module level. However, such testing may increase manufacturing costs because circuit defects are not detected until after a chip has been formed into a module (e.g., packaged). Other conventional methods of testing an analog circuit may employ additional circuitry to convert analog signals to digital signals and vice versa during a test at the wafer level. However, such additional circuitry is large and complex, and therefore, causes an increase in wafer chip size. Therefore, improved methods and apparatus for testing an analog circuit at a wafer level are desired.

SUMMARY OF THE INVENTION

In a first aspect of the invention, a method of testing an analog circuit is provided. The method includes (1) providing the analog circuit with a screening circuit adapted to cause the analog circuit to function like a logic gate during a test; and (2) applying digital signals to the analog circuit to test the analog circuit at a wafer level so as to detect a defect in one or more components of the analog circuit.

In a second aspect of the invention, an analog circuit is provided that includes a screening circuit adapted to cause the analog circuit to function like a logic gate and to allow the analog circuit to receive digital signals and to undergo testing at a wafer level so as to detect a defect in one or more components of the analog circuit.

In a third aspect of the invention, a semiconductor wafer is provided that includes an analog circuit. The analog circuit, formed on the semiconductor wafer, includes a screening circuit adapted to cause the analog circuit to function like a logic gate and to allow the analog circuit to receive digital signals and to undergo testing at a wafer level so as to detect a defect in one or more components of the analog circuit. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides improved methods and apparatus for testing an analog circuit. More specifically, the present invention provides improved methods and apparatus for testing an analog circuit at a wafer level using digital testing methods. An amount of circuitry employed for such methods and apparatus may be reduced compared to conventional circuitry employed to convert analog signals to digital signals and vice versa during a test at the wafer level. In this manner, the present methods and apparatus may provide an improved screening functionality of one or more portions of an analog circuit at the wafer level. For example, in a first embodiment, the present invention provides methods and apparatus that allow a signal detector to test similar to a logic gate, such as an XOR gate. Additionally, according to the present invention, methods and apparatus are provided that allow current digital-to-analog converters (IDACs) included in the signal detector to test similar to a logic gate, such as an OR gate. In a second embodiment, the present invention provides methods and apparatus that allow a Joint Test Action Group (JTAG) receiver to test similar to a logic device, such as a multiplexer.

In this manner, a reduced amount of circuitry (compared to conventional testing methods) may be employed to test an analog circuit at a wafer level, and digital test methods may be used for the test. Consequently, one or more portions of the analog circuit may be screened for defects at the wafer level, thereby reducing manufacturing costs.

Figure 1:
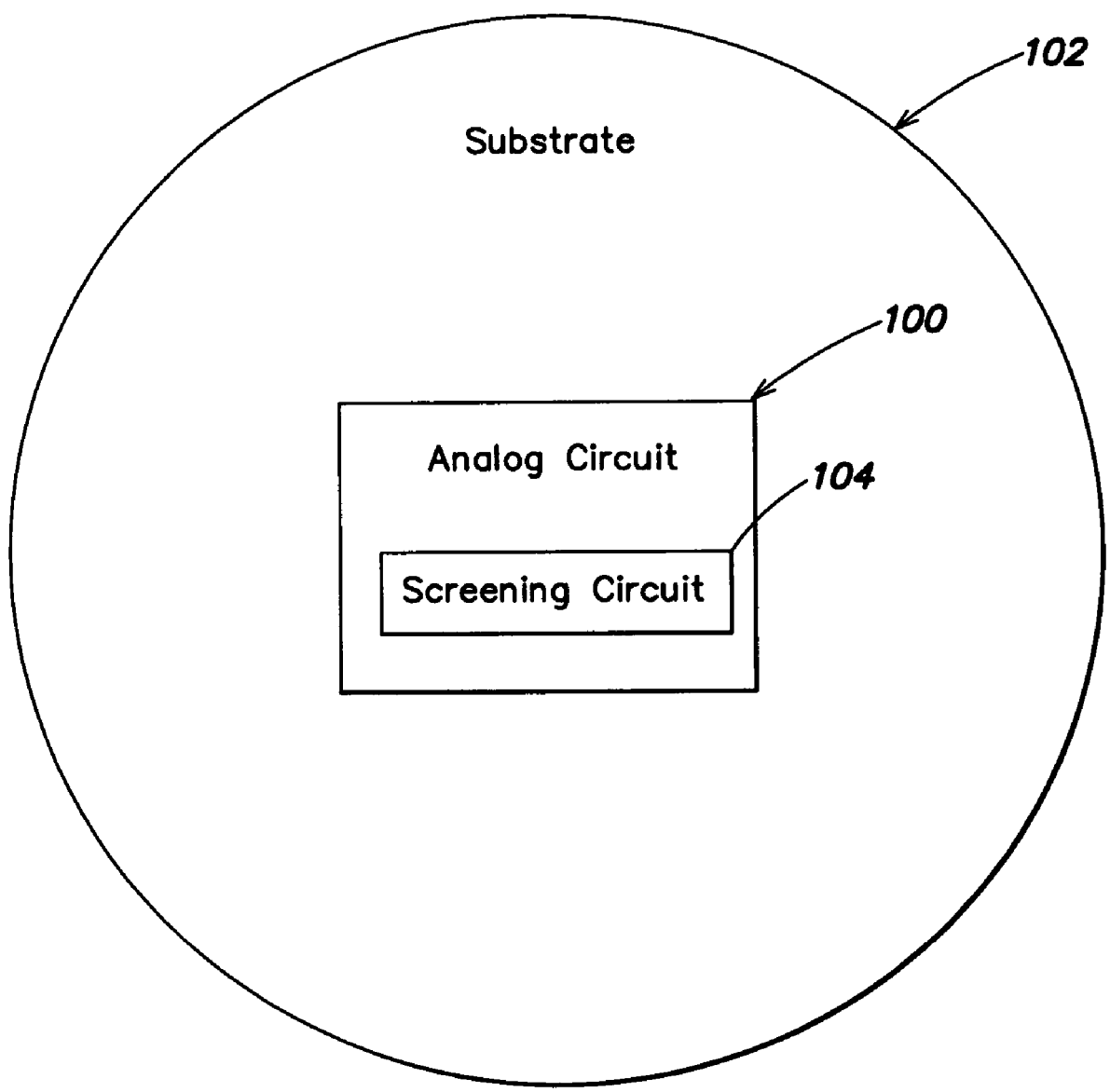
FIG. 1 is a schematic diagram of an apparatus for testing an analog circuit in accordance with an embodiment of the present invention.

FIG. 1 is a schematic diagram of an apparatus for testing a circuit in accordance with an embodiment of the present invention. With reference to FIG. 1, an analog circuit 100 may be formed on a semiconductor substrate 102 such as a wafer or the like. The analog circuit 100 may be a signal detector, JTAG receiver or another suitable circuit. During subsequent processing, the analog circuit 100 may be removed from the semiconductor substrate 102 and packaged into a module. Once packed into the module, the analog circuit 100 may be tested using high-speed analog test methods. In this manner, defects in one or more of a plurality of analog circuits packaged into respective modules may be detected. As described previously, detecting defective analog circuits 100 before packaging into respective modules may reduce semiconductor device manufacturing costs and improve semiconductor device manufacturing throughput. Consequently, in accordance with the present invention, the analog circuit 100 may include and/or be coupled to a screening circuit 104 adapted to cause the analog circuit 100 and/or components therein to function like a logic gate. Therefore, signals (e.g., digital and/or analog) may be applied to the screening circuit 104 while the analog circuit 100 is still part of the wafer 102 to determine whether the analog circuit 100 functions like a logic gate, such as an OR gate, XOR gate, select gate (e.g., multiplexer) or another suitable logic gate. The screening circuit 104 may be implemented, for example, via combinational and/or sequential logic or as an application specific integrated circuit (ASIC).

In this manner, the analog circuit 100 may be tested (e.g., as if the analog circuit 100 is a digital circuit) at a wafer level so as to detect a defect in one or more components of the analog circuit 100. More specifically, one or more portions or blocks of the analog circuit 100 may be tested like a logic gate so that gross defects due to fabrication, design, human or other types of errors may be detected in an early stage of the semiconductor device manufacturing and/or testing process, which is more economical than detecting such defects after packaging into a module. However, the analog circuit 100 retains the ability to be tested using high-speed analog test equipment at a module level. Therefore, analog circuits 100 which pass the wafer level screen test, and thereafter, are packaged into modules, may be tested for defects using high-speed analog test methods.

Figure 2:
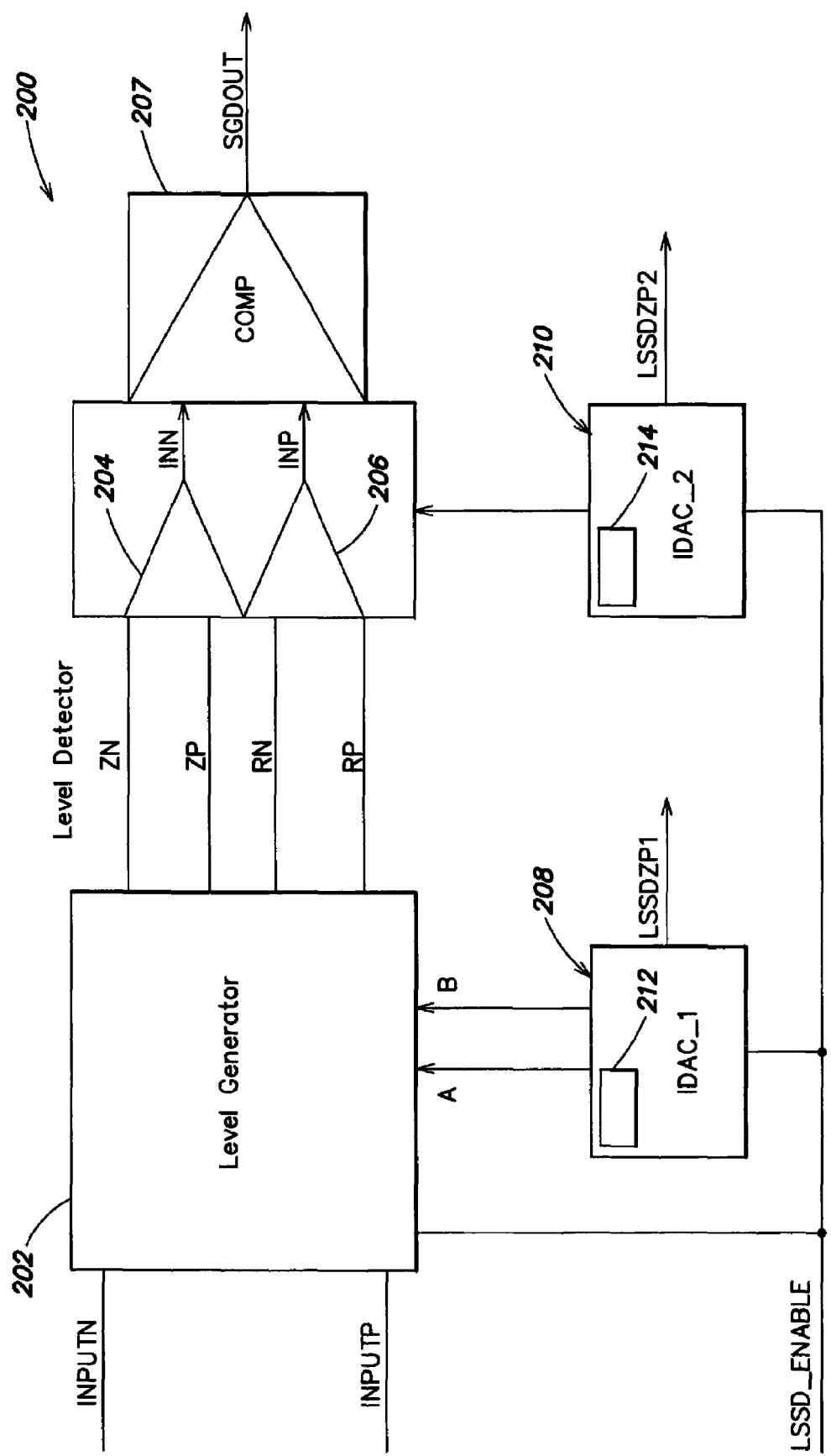
FIG. 2 is an exemplary embodiment of the invention in which the analog circuit of FIG. 1 is a signal detector.

FIG. 2 is an exemplary embodiment of the invention in which the analog circuit 100 is a signal detector 200. With reference to FIG. 2, the signal detector 200 may include a level generator 202 adapted to create a threshold voltage level coupled to level detectors 204-206. The level detectors 204 are coupled to a comparator 207.

The signal detector 200 also includes a first current digital-to-analog converter (IDAC_1) 208 coupled to the level generator 202, and a second current digital-to-analog converter (IDAC_2) 210 coupled to the level detectors 204-206. The first IDAC 208 may be, for example, adapted to provide threshold level calibration and the second IDAC 210 may be adapted to provide a DC offset calibration.

The signal detector 200 may be similar to, and operate similar to, a conventional signal detector. However, in contrast, the first and second IDACs 208-210 include respective screening logic 212-214 similar to that described above with reference to FIG. 1. Details of such screening logic 212-214 are described below with reference to FIGS. 3-4, respectively.

In accordance with the present invention, the signal detector 200 may be tested at the water level like an XOR gate or another suitable logic gate. In one or more embodiments, a first digital (e.g., LSSD) test method, which is triggered by an LSSD_ENABLE control signal, may be employed to determine defects in the signal detector 200. For example, a pair (e.g., differential pair) of test signals INPUTN, INPUTP may be input to the level generator 202. During a test of the signal detector 200 at the wafer level, an on-chip test driver (not shown) may be employed to generate the pair of test signals. For example, the differential test signal pair INPUTN, INPUTP may include waveforms having a peak-to-peak amplitude of about 400 mV to about 800 mV (although a larger or smaller and/or different peak-to-peak amplitude range may be employed). During proper operation, the signal detector 200 is adapted to output a signal SGDOUT of a "high" state when responding to a test signal pair, one of which is of a "high" state and one of which is of a "low" state. Additionally, the signal detector 200 is adapted to output a signal SGDOUT of a "low" state when responding to a test signal pair both of which are of a "high" state or both of which are of a "low" state. In this manner, the signal detector 200 may detect complementary incoming signals, and if such signals move up and down together (e.g., are in phase), may determine that a short may exist (e.g., in one or more components of the signal detector 200). One or more values output by the signal detector 200 may be stored in respective registers (not shown). In this manner, a low-cost logic screening test method may be provided to determine whether the signal detector 200 behaves like an XOR gate so that faulty or defective circuits are eliminated early in the semiconductor device manufacturing process (e.g., at the wafer level).

The above described LSSD test method may be employed to screen the signal detector 200 at the wafer level for defects. However, such a test method may not determine whether the signal detector complies with desired analog specifications. For example, the first LSSD test method may not determine whether a signal detector can detect a signal having a targeted "high" level or un-detect a signal having a targeted "low" level. Such testing may be performed using analog test methods at a module level. More specifically, such testing may be performed after the signal detector 200 is screened for defects at the wafer level, removed from the wafer and packaged into a module.

Figure 3:
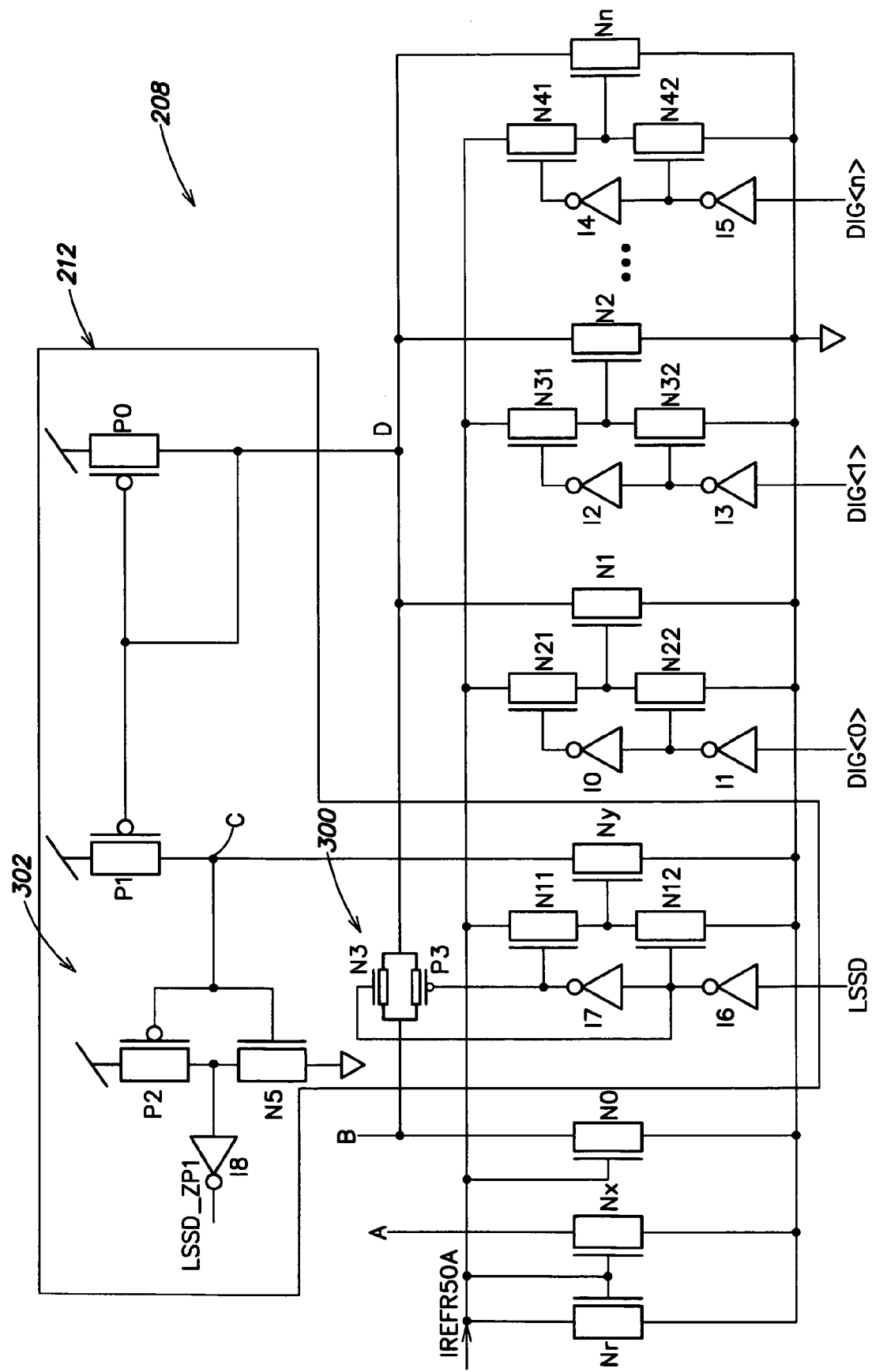
FIG. 3 is a schematic diagram of a first exemplary current digital-to-analog converter included in the signal detector of FIG. 2 in accordance with an embodiment of the present invention.

FIG. 3 is a schematic diagram of an exemplary current digital-to-analog converter 208 included in the signal detector of FIG. 2 in accordance with an embodiment of the present invention. With reference to FIG. 3, the first IDAC 208 may serve as a threshold level calibration unit. More specifically, the first IDAC 208 may be used to update one or more signal threshold levels so that a single circuit design (e.g., signal detector design) may be used by many customers with different respective specifications. Consequently, the signal detector 200 may be employed in different power supply environments or at a single power supply level but with different signal specifications each of which may define a range or target for a "high" signal (e.g., a good signal) and/or a "low signal" (e.g., a bad signal). In some embodiments, a signal specification may define a range between a "low signal" to a "high signal" of about 87.5 mV to about 175 mV for Inifiniband, about 120 mV to about 240 mV for SAS and/or about 200 mV to about 400 mV for FibreChannel (although a larger or smaller and/or different range may be employed for any of such protocols). Thus, the first IDAC 208 may be employed to adjust a threshold level for detecting signals of different levels. In this manner, as stated, a single IDAC design may accommodate specifications of a plurality of customers.

The first IDAC 208 may be similar to an IDAC employed in a conventional signal detector. However, in contrast, the first IDAC 208 of the signal detector (200 in FIG. 2) may be adapted so that the first IDAC 208 tests like an OR gate or another suitable logic gate at the wafer level. More specifically, the first IDAC 208 may include screening logic 212 adapted to cause the first IDAC 208 to behave like an OR gate or another suitable logic gate during a test at the wafer level.

As described below, an LSSD test method, which is triggered by the LSSD control signal, may be employed to test binary bits fed from a logic core. In this manner, the LSSD test may determine whether wiring and/or devices associated with the binary bits are faulty or defective. Thus, a digital test method (e.g., an LSSD test method) may be employed at the wafer level to detect defects in wiring and/or devices in the first IDAC 208. However, the first IDAC 208 retains the ability to be tested using analog test methods after the signal detector is packaged into a module.

The first IDAC 208 may include devices (e.g., transistors, inverters, etc.) Nr, Nx, N0, I7, I6, N11, N12, Ny, I0, I1, N21, N22, N1, I2, I3, N31, N32, N2 ... I4, I5, N41, N42, Nn, N3, P3, P2, N5, P1, P0, I8 coupled as shown where "N" refers to an NFET and "P" refers to a PFET (although the first IDAC 208 may include a larger or smaller number of and/or different devices, which may be coupled in a different manner). In some embodiments, the size of transistor Ny may be approximately half that of transistor N1. Similarly, the size of transistor N1 may be approximately half that of transistor N2, and so on. However, the relative sizes of such devices may be different.

The screening logic 212 may include devices I6, I7, I8, N11, N12, Ny, N3, P3, P2, N5, P1, P0 coupled as shown, (although the screening logic 212 may include a larger or smaller number of and/or different devices, which may be coupled in a different manner).

The first IDAC 208 may be adapted to receive signals LSSD, and DIG<0> through DIG<n>, as inputs and output signal LSSD_ZP1 and/or source current IREF50A. DIG<0> through DIG<n> may be digital signals in which DIG<0> may serve as a least significant bit (LSB) and DIG<n> may serve as a most significant bit (MSB) of a binary signal used to select the value of a current provided to the level generator 202 (FIG. 2). Nodes A and B of the first IDAC 208 may be coupled to circuitry such as a differential amplifier and a level-setting circuit, respectively, in the level generator 202 in FIG. 2 (see labels A and B in FIG. 2).

The first IDAC 208 may be adapted to provide at least one preset threshold level for detecting a signal. In this manner, the signal detector 200 including the first IDAC 208 may be functional while an LSSD test is performed on the first IDAC 208. For example, to establish such a threshold level, the first IDAC 208 may be designed to source current (e.g., a constant current), for example, via mirror transistors Nx and Nr. The mirror transistors may source current even when all the digital signals (e.g., binary bits) DIG<0> through DIG<n> are deasserted (e.g., shut off). In this manner, while an LSSD test is performed on the first IDAC 208, even if all the remaining mirror devices (e.g., devices N1 through Nn) are turned off, the signal detector 200 still functions.

The first IDAC 208 may be designed such that the preset threshold level is sufficiently low so as to detect incoming test signals. However, the preset threshold level may not be so low that the signal detector 200 would be unable to function as an XOR gate or another suitable gate during testing. In at least one embodiment, when all binary bits DIG<0>-DIG<n> are off, the preset threshold level is about 30 mV, although other values may be used.

The screening circuit 212, which enables the first IDAC 208 to be tested using an LSSD test method and causes the first IDAC 208 to test like an OR gate during such LSSD test method, is now described. As stated, nodes A and B of the first IDAC 208 may be coupled to the level generator 202 (FIG. 2) for supplying a current to the level generator and setting a threshold level of the level generator 202. Devices N3 and P3 of the screening circuit 212 may serve as a switch device 300 that may isolate the node B from a node D. For example, setting LSSD to a high logic state turns off transistors N3 and P3 and isolates node B from node D. In this manner, the first IDAC 208 may be isolated from remaining portions of the signal detector 200 (e.g., the main circuit).

Additionally, the screening circuit 212 includes a comparator 302 formed from devices P0, P1, P2, N5 and an inverter I8.

Once the first IDAC 208 is isolated (e.g., via the switch device 300), DIG<0> through DIG<n> may be asserted individually (e.g., sequentially), to test the devices associated with each signed path (e.g., I0, I1, Nz1, Nz2, I2, I3, N31, N32, etc.). When LSSD is in a high state and all digital signals (e.g., bits) DIG<0> through DIG<n> are of a "low" state, no current flows through node D, and node D will float to VDD. P1 and P0 are off, and node C is pulled low due to leakage through NY. Accordingly, the signal LSSD_ZP1 output from the first IDAC 208 is at a "low" state. Otherwise, the signal LSSD_ZP1 output from the first IDAC 208 is at a "high" logic state. However, if test signal LSSD is asserted and any of the digital signals DIG<0> through DIG<n> are asserted (e.g., switched on), current provided to (e.g., sunk at) node D may be mirrored to node C via devices P0 and P1. Because of its smaller size, device Ny sinks less current than is provided at node D. Therefore, the voltage at node C rises and eventually triggers the signal LSSD_ZP1 output from the first IDAC 208 to be asserted (e.g., go "high"). That is, because device Ny is only half the size of the device N1 (which corresponds to the LSB (e.g., DIG<0>), when any of the digital signals (e.g., binary bits) are asserted, the screening logic 212 triggers the output LSSD_ZP1 of the first IDAC 208 to go high. In this manner, the first IDAC 208 may be behave like and test like an OR gate such that each bit DIG<0>-DIG<n> (and wiring and devices corresponding therewith) can be individually tested at the wafer level (e.g., I6, I7, N11, N12, I0, I1, N21, N22, N1, I2, I3, N31, N32, N2, etc.).

Figure 4:
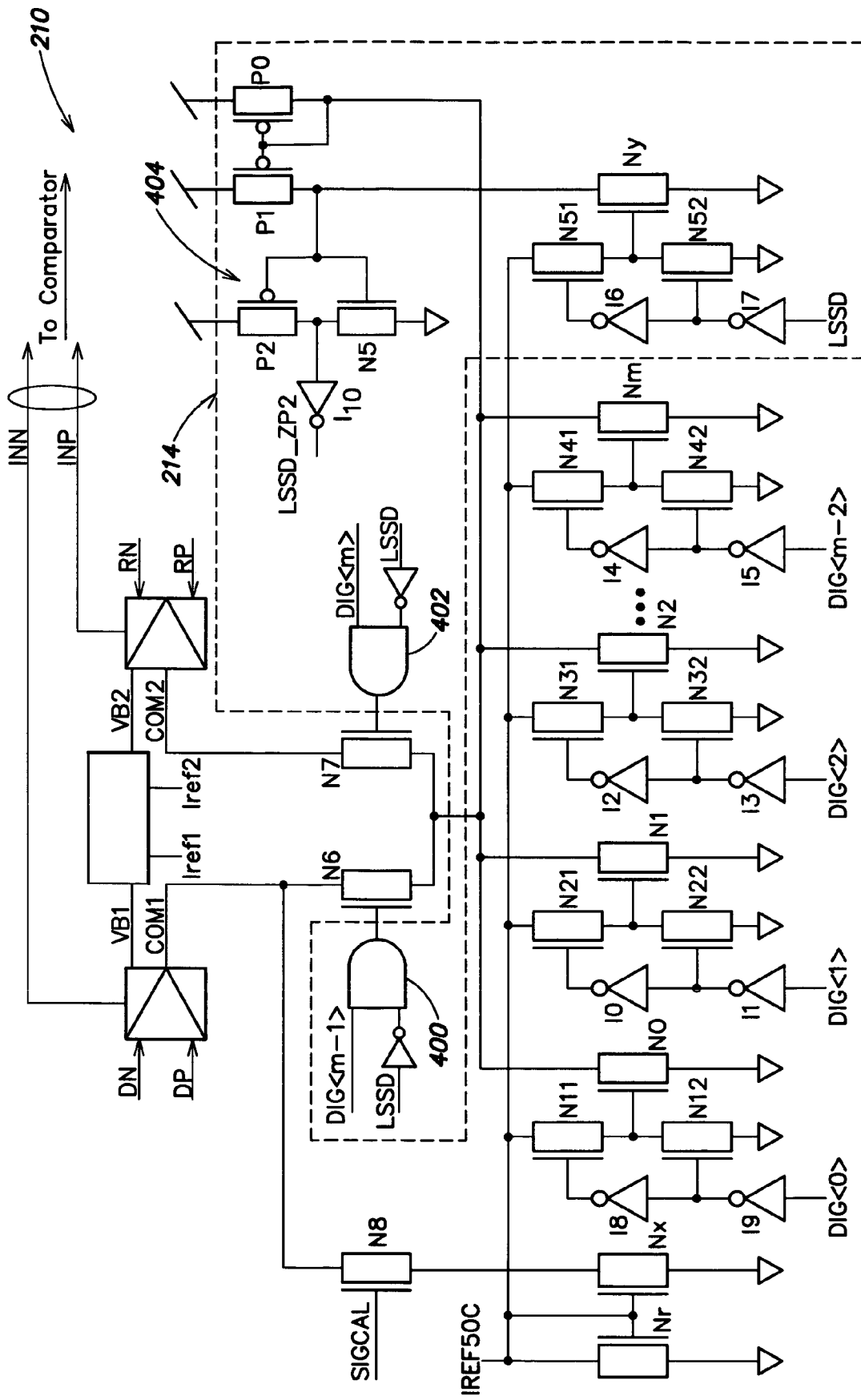
FIG. 4 is a schematic diagram of a second exemplary current digital-to-analog converter included in the signal detector of FIG. 2 in accordance with an embodiment of the present invention.

FIG. 4 is a schematic diagram of an exemplary current digital-to-analog converter 210 included in the signal detector of FIG. 2 in accordance with an embodiment of the present invention. With reference to FIG. 4, the second IDAC 210 may serve as a DC offset calibration unit. More specifically, the second IDAC 210 may be adapted to calibrate a DC offset between a pair (e.g., complementary pair) of signals received by the second IDAC 210. A DC offset may be introduced during circuit layout and/or during fabrication, and may cause one side of a signal to be loaded differently than the other side. Therefore, the second IDAC 210 may be adapted to balance such offsets during a calibration mode. Digital signals DIG<0>-DIG<m> may be used to decode the second IDAC 210 and adjust a threshold or offset as described above. Similar to the first IDAC 208, the second IDAC 210 may be tested while the signal detector 200, including the second IDAC 210, remains functional.

The second IDAC 210 may be similar to an IDAC employed in a conventional signal detector. However, in contrast, the second IDAC 210 of the signal detector (200 in FIG. 2) may be adapted so that the second IDAC 210 tests like an OR gate at the wafer level. More specifically, the second IDAC 210 may include screening logic 214 adapted to cause the second IDAC 210 to behave like an OR gate during a test at the wafer level. Portions of the second IDAC 210 which may be similar to the IDAC included in a conventional signal detector are not described in detail herein.

As described further below, an LSSD test method may be employed to determine whether wiring and/or devices of the second IDAC 210 (adapted to receive digital signals) are faulty or defective. However, the second IDAC 210 retains the ability to be tested using analog test methods after the signed detector is packaged into a module.

The second IDAC 210 may include devices (e.g., transistors, inverters, AND gates, etc.) Nr, Nx, I8, I9, N11, N12, N0, I0, I1, N21, N22, N1, I2, I3, N31, N32, N2, . . . I4, I5, N41, N42, Nm, I6, I7, N51, N52, Ny, N8, N6, N7, I10, P2, N5, P1, P0, 400, 402 coupled as shown (although the second IDAC 210 may include a larger or smaller number of and/or different devices, which may be coupled in a different manner). In some embodiments, the size of device Ny may be approximately half that of device N0 (e.g., the LSB device). Similarly, the size of device N0 may be approximately half that of device N1, and so on.

The screening logic 214 may include devices I6, I7, N51, N52, Ny, I10, P2, N5, P1, P0, 400, 402 coupled as shown. Devices P2, N5, P1, and P0 may serve as a comparator 404 of the screening logic 214. The second IDAC 210 may be adapted to receive signals LSSD, DIG<0>, DIG<1>, DIG<2> through DIG<m>, and SIGCAL as inputs and output signal LSSD_ZP2 and source current IREF50C. DIG<0> through DIG<m> may be digital signals in which DIG<0> may serve as a least significant bit (LSB) and DIG<M> may serve as a most significant bit (MSB) for adjusting a current (IREF50C) supplied to the level detector 204 (FIG. 2).

The second IDAC 210 may be designed so that a digital test method (e.g., an LSSD test method) may be employed at the wafer level to detect defects in wires and/or devices of the second IDAC 210 (e.g., the wires and/or devices associated with DIG<0>-DIG<m> and LSSD). For example, devices N6, N7, 400, 402 may be adapted to isolate the portion of the second IDAC 210 described above from one or more remaining (upper) portions of the second IDAC 210 and/or from the signal detector 200. When LSSD is asserted, devices N6 and N7 are switched off by AND gates 400, 402, respectively, the upper portion of the second IDAC 210 is isolated from the signal paths associated with DIG<0>-DIG<m−2> and LSSD, and DIG<0>-DIG<m−2> are ready for testing. Once isolated, the signal paths and/or devices associated with DIG<0>-DIG<m> may be tested as described with regard to DIG<0>-DIG<n> in FIG. 2. For example, when LSSD is in a high state and all digital signals DIG<0>-DIG<m> are low, the output signal LSSD_ZP2 is low. If any of DIG<0>-DIG<m−2> are high, LSSD-ZP2 is pulled high. DIG<0>-DIG<m−2> may be tested individually, such that the screening circuit 214 may function in a manner similar to the screening circuit 212 of FIG. 3 so as to cause (portions of) the second IDAC 210 to behave like an OR gate during a digital test at the wafer level.

Figure 5:
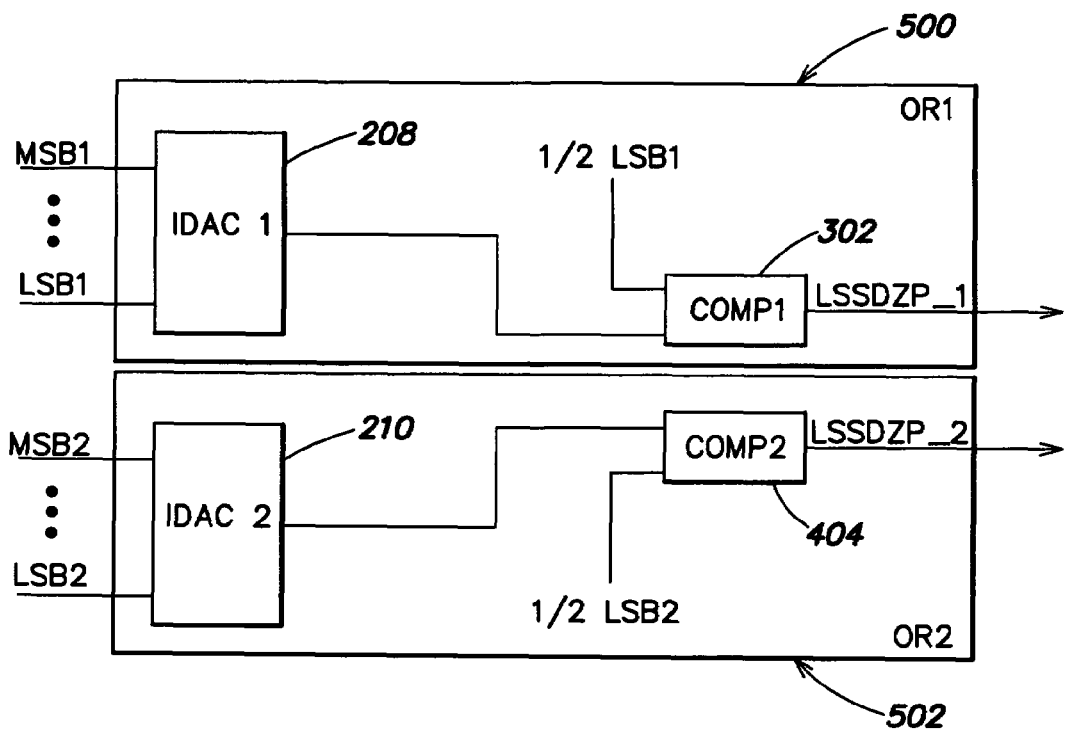
FIG. 5 is a functional representation of the first and second exemplary current digital-to-analog converters of FIGS. 3 and 4 in accordance with an embodiment of the present invention.

FIG. 5 is a functional representation of the first and second exemplary current digital-to-analog converters 208, 210 in accordance with an embodiment of the present invention. With reference to FIG. 5, during a wafer level test of the first and second IDACs 208, 210 of the signal detector 200 using digital test methods, the first IDAC 208 may test like a first OR gate 500 and the second IDAC 210 may test like a second OR gate 502. Digital signals (e.g., bits) such as DIG<0> through DIG<n> of FIG. 3, which correspond to LSB1 to MSB1, may be input by the first IDAC 208. Based on such digital signals, the first IDAC 208 may provide a signal to the comparator 302 (FIG. 3). The comparator 302 compares the current from IDAC 208 to the current through transistor NY (of FIG. 3), represented as ½ LSB1 in FIG. 5. When all digital signals (e.g., bits) DIG<0> through DIG<n> are of a "low" state, the signal LSSD_ZP1 output from the first IDAC 208 is a "low" state. Otherwise, the signal LSSD_ZP1 output from the first IDAC 208 is a "high" state.

Similarly as shown in FIG. 5, digital signals (e.g., bits) such as DIG<0> through DIG<m−2> of FIG. 4, which correspond to LSB2 to MSB2, may be input by the second IDAC 210. Based on such digital signals, the second IDAC 210 may provide a signal to the comparator 404 (FIG. 4). The comparator 404 compares the current from IDAC 210 to the current through transistor NY (of FIG. 4), represented as ½ LSB2 in FIG. 5. When all digital signals (e.g., bits) DIG<0> through DIG<m−2> are of a "low" state, the signal LSSD_ZP2 output from the second IDAC 210 is a "low" state. Otherwise, the signal LSSD_ZP2 output from the second IDAC 210 is a "high" state.

Figure 6:
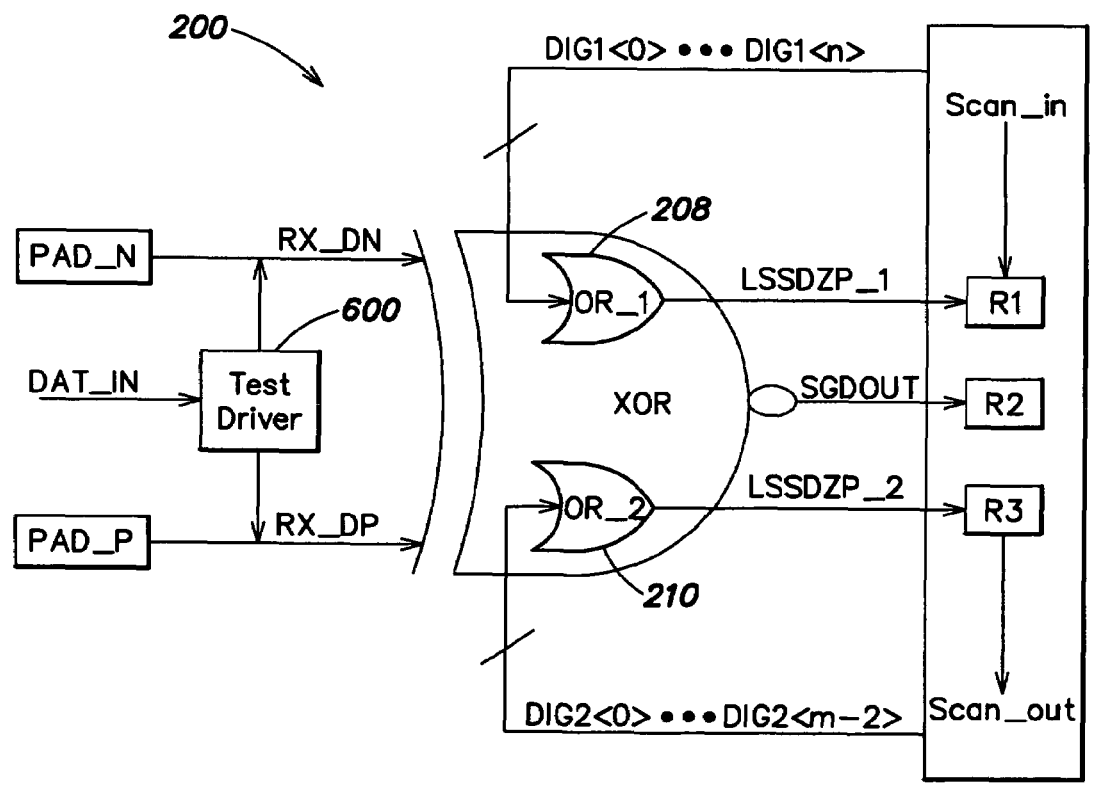
FIG. 6 is a functional representation of the signal detector of FIG. 2 in accordance with an embodiment of the present invention.

FIG. 6 is a functional representation of the signal detector 200 of FIG. 2 in accordance with an embodiment of the present invention. With reference to FIG. 6, test driver 600 may be employed to create a differential signal pair RX_DN, RX_DP based on a signal DAT_IN, which may be a rail-to-rail test data signal input by the test driver 600. (Note that during such testing, PAD_N and PAD_P are not employed). During a wafer level test in which digital test methods are employed, RX_DN and RX_DP may be input to the signal detector 200 (represented as an XOR gate) which includes the first IDAC 208 (represented as a first OR gate OR_1) and the second IDAC 210 (represented as a second OR gate OR_2). Based on RX_DN and RX_DP signals input to the signal detector 200, the signal detector 200 may output SGDOUT which should represent a result of an XOR-operation per-formed on the RX_DN and RX_DP signal pair. In this manner, the signal detector 200 may be tested at a wafer level for defects using digital test methods. The output SGDOUT may be collected by a shift register R2 and scanned out for analysis.

Similarly, during a wafer level test in which digital test methods are employed, a plurality of digital signals (e.g., bits) DIG1<0> to DIG1<n> which may correspond to DIG<0> to DIG<n> of FIG. 3 may be input by the first IDAC 208. Based on DIG1<0> to DIG1<n>, the first IDAC 208 may output LSSDZP_1 which should represent a result of an OR operation performed on DIG1<0> through DIG1<n>. In this manner, the first IDAC 208 may be tested at a wafer level for defects using digital test methods. The output LSSDZP_1 may be collected by a shift register R1 and scanned out for analysis.

Similarly, during a wafer level test in which digital test methods are employed, a plurality of digital signals (e.g., bits) DIG2<0> to DIG2<m−2> (which may correspond to DIG<0> through DIG<m−2> of FIG. 4) may be input by the second IDAC 210. Based on DIG2<0> to DIG2<m−2>, the second IDAC 210 may output LSSDZP_2 which should represent a result of an OR operation performed on DIG2<0> to DIG2<m−2>. In this manner, the second IDAC 210 may be tested at a wafer level for defects using digital test methods. The output LSSDZP_2 may be collected by a shift register R3 and scanned out for analysis.

Through use of the present methods and apparatus, an analog circuit, such as a signal detector, may be adapted so as to behave like a logic gate (e.g., an XOR gate) when a wafer level test employing digital test methods (e.g., LSSD testing) is performed. Additionally, one or more components of the analog circuit, such as a first and second IDAC 208, 210 may be adapted so as to behave as a logic gate (e.g., an OR gate) when the wafer level test employing digital test methods is performed. Thus, the analog circuit may be screened for defects at the wafer level.

Figure 7:
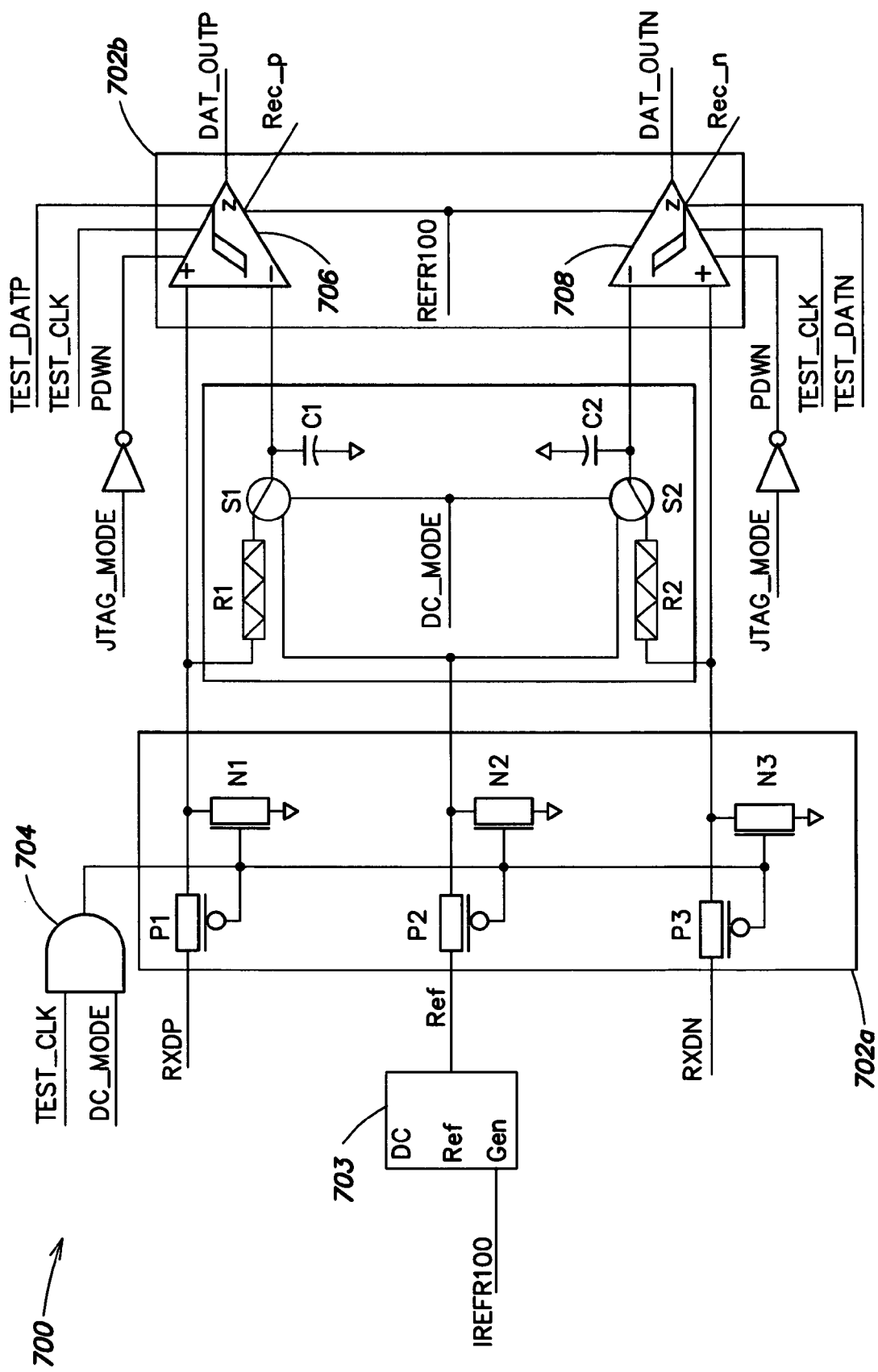
FIG. 7 is a schematic diagram of a Joint Test Action Group (JTAG) receiver in accordance with an embodiment of the present invention.

FIG. 7 is a schematic diagram of a Joint Test Action Group (JTAG) receiver 700 in accordance with an embodiment of the present invention. In at least one embodiment, the analog circuit 100 in FIG. 1 may be the JTAG receiver 700.

The JTAG receiver 700 may be similar to a conventional JTAG receiver. For example, the JTAG receiver 700 may be adapted to detect cable connectivity, and the JTAG receiver 700 may be required to comply with both AC and DC mode operation conditions. Further, the JTAG receiver 700 preferably may be pre-loaded to a known initial state.

During AC operation, since incoming data is capacitively coupled, the internal nodes of the JTAG receiver 700 may easily be set to a known state, either high or low. In conventional JTAG receivers, during the DC mode, incoming signals strongly hold the input pins of such a JTAG receiver, and therefore, internal nodes of the JTAG receiver cannot easily be set to the opposite state. Further, in such JTAG receivers, it is especially difficult to reset an internal state during testing, since the incoming signals are fed via a local test driver with higher signal amplitudes. In addition, such JTAG receivers include a hysteresis device to hold the data firmly against noise spikes. Under such situations, reset features such as TEST_DATA and TEST_CLOCK cannot be tested. Thus, the yield of the product is compromised.

To avoid such disadvantages, in contrast to conventional JTAG receivers, the JTAG receiver 700 (e.g., an ACJTAG receiver) may include screening logic 702a, 702b that performs an operation similar to the screening logic described above with reference to FIG. 1. In some embodiments, the JTAG receiver 700 may differ from a conventional JTAG receiver in a different and/or additional manner. The JTAG receiver 700 as shown in FIG. 7 may include devices (e.g., transistors, resistors, capacitors, hysteresis comparators, logic gates, switches, etc.) P1, P2, P3, N1, N2, N3, R1, R2, S1, S2, C1, C2, 703, 704, 706, 708 coupled as shown (although the JTAG receiver 700 may include a larger or smaller number of and/or different devices, which may be coupled in a different manner).

The screening logic 702a, 702b may include devices P1, P2, P3, N1, N2, N3, 706, 708 coupled as shown. The JTAG receiver 700 may be adapted to receive signals TEST_CLK, DC_MODE, RXDP, IREFR100, RXDN, TEST_DATAP, PDWNN, and TEST_DATAN as inputs and output signals DAT_OUT_P and DAT_OUT_N.

Through use of the screening logic 702a, 702b, the inventive JTAG receiver 700 is adapted to test like a multiplexer. In this manner, a digital test method triggered by TEST_CLK (e.g., an LSSD test method) may be employed to determine defects in the JTAG receiver 700. For example, in block 702b, when TEST_CLK is in a "high" state, the TEST_DAT (e.g., TEST_DATP, TEST_DATN) may be selected to be sent to the output. Otherwise, the incoming data signal (e.g., RXDP, RXDN) may be sent out. The JTAG receiver 700 can function like a multiplexing device in the AC and DC mode. Further, during the DC mode, the JTAG receiver 700 is adapted to block incoming signals RXDP, RXDN and/or the DC reference signal "Ref" from reaching a hysteresis comparator device 706-708. This is done by block 702b. That is, in DC test mode, when TEST_CLK is high, signals RXDP, RXDN and Ref are grounded via devices N1, N2 and N3. Once RXDP, RXDN and the DC reference signals are disabled, the internal nodes of the comparators 706, 708 may be preset to a known state via TEST_DAT (e.g., TEST_DATP, TEST_DATN) and TEST_CLK applied to respective control pins of the comparators 706, 708. In this manner, the JTAG receiver 700 may be tested at the wafer level using a digital (e.g., LSSD) test method and may behave like a multiplexing device during such a test method. The digital test method performed at the wafer level may be a DC test. During such test, as stated, a DC reference level generated from DC reference generator 703 may be isolated so that both comparators 706, 708 may be tested like multiplexers.

In this manner, a low-cost logic screening test method may be provided to determine whether the JTAG receiver 700 behaves like a multiplexer so that faulty or defective circuits are eliminated early in the semiconductor device manufacturing process (e.g., in the wafer level). However, such a test method may not determine whether the JTAG receiver 700 complies with desired analog specifications. Such testing may be performed using analog test methods at a module level after the JTAG receiver 700 is screened for defects at the wafer level, removed from the wafer and packaged into a module.

Figure 8:
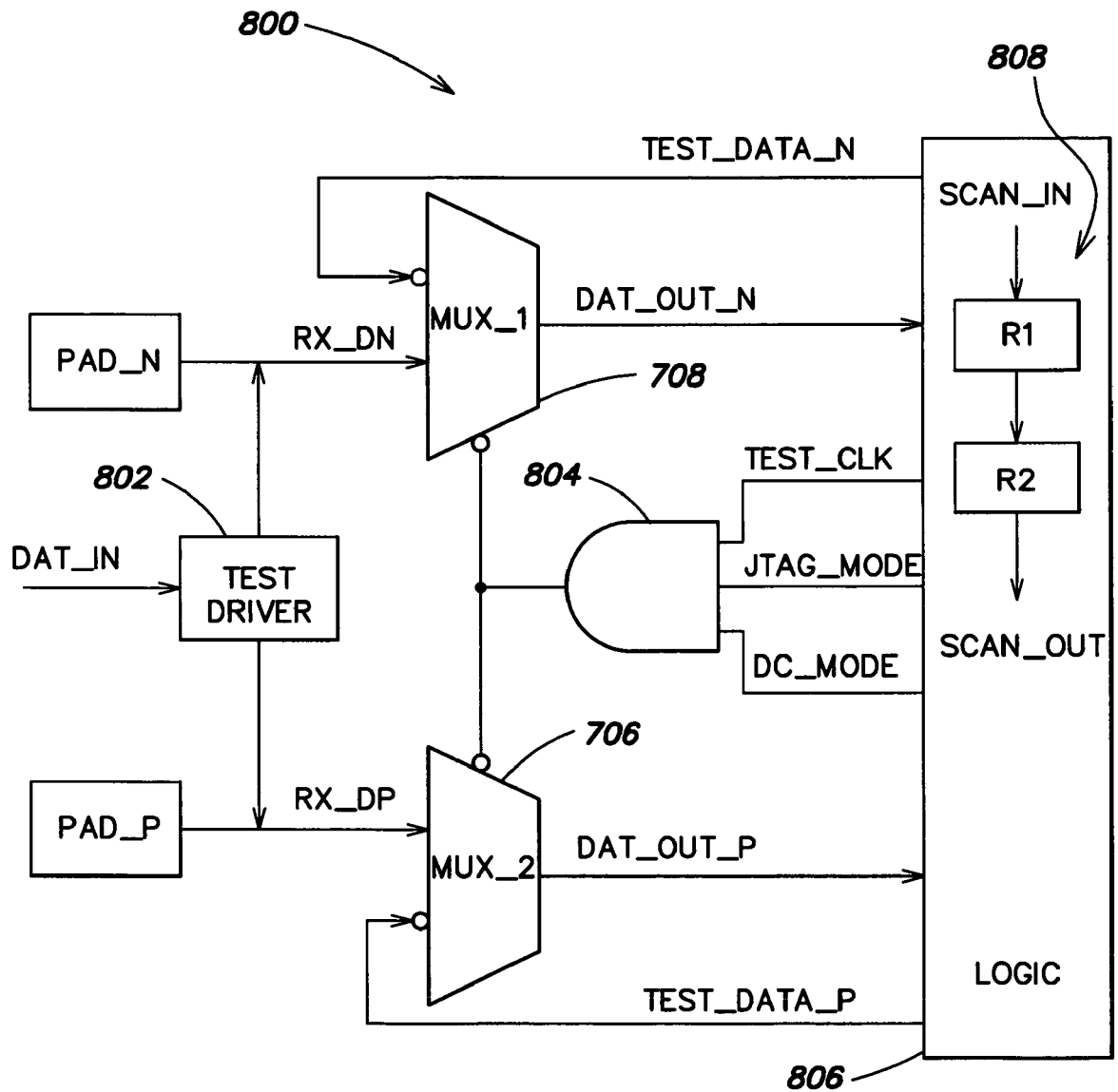
FIG. 8 is a functional diagram of the JTAG receiver of FIG. 7 in accordance with an embodiment of the present invention.

FIG. 8 is a functional diagram of the JTAG receiver of FIG. 7 in accordance with an embodiment of the present invention. With reference to FIG. 8, test architecture 800 of the JTAG receiver 700 may behave like a pair of multiplexers. For example, a test driver 802, which may be coupled to and/or included in the JTAG receiver 700, may generate complementary signals RXDN and RXDP based on DAT_IN input by the test driver 802. Such signals may be provided to respective hysteresis comparators 706, 708 (represented as multiplexers MUX_1, MUX_2). The hysteresis comparators 706, 708 may receive respective signals from remaining portions of the test architecture 800 or another circuit such as one or more registers or other logic. For example, the first hysteresis comparator 706 may receive TEST_DATP and the second hysteresis comparator 708 may receive TEST_DATN as inputs from remaining portions of the test architecture 800 or another circuit. Further, remaining portions of the test architecture 800 or another circuit may provide a control signal to each hysteresis comparator 706, 708 which may be based on TEST_CLK, a DC_MODE signal and a JTAG_MODE signal. More specifically, each hysteresis comparator 706, 708 may be controlled by the product of three signals, TEST_CLK, DC_MODE and JTAG_MODE. The product may be "effectively" computed using logic, such as an AND gate 804 (e.g., a three-input AND gate) or another suitable device. When all of these signals are asserted, the hysteresis comparator 706, 708 may selectively output signal TEST_DAT (e.g., TEST_DATN or TEST_DATP), otherwise the hysteresis comparator 706, 708 may selectively output signal RXD (e.g., RXDN or RXDP). The output of the comparators 706, 708 may be sent to logic 806 which may include one or more shift registers and/or scan chains 808. When the TEST_CLK is deasserted, the comparator 706, 708 may selectively output signal RXD (e.g., RXDN or RXDP) generated by the test driver 802. In this manner, signals such as TEST_DATN, TEST_DATP, TEST_CLK, etc. and associated circuitry may be tested at the wafer level using a digital (e.g., LSSD) test method. Note that when JTAG_MODE is low, PDWN is high, and vice versa.

Figure 9:
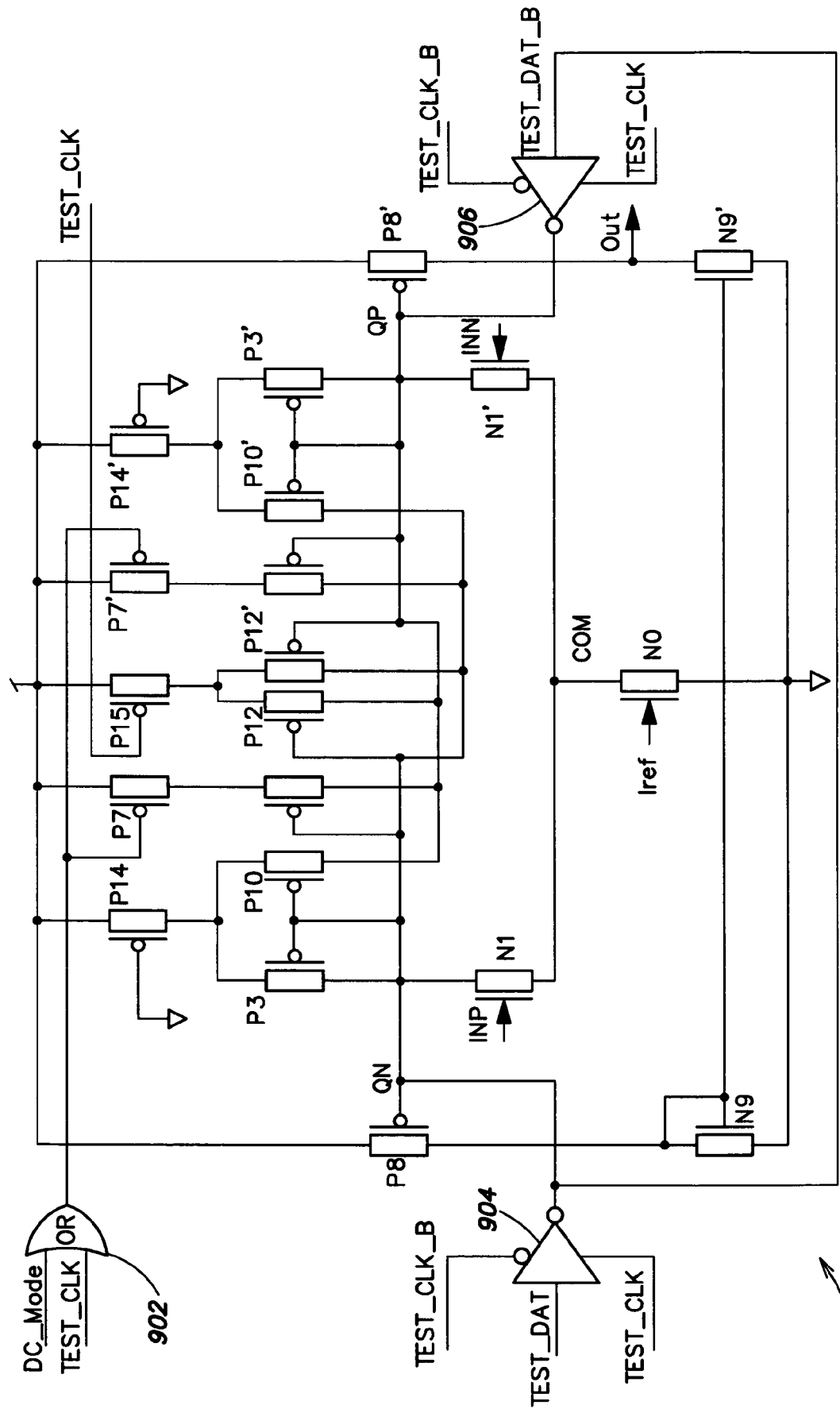
FIG. 9 is a schematic diagram of an exemplary hysteresis comparator of the JTAG receiver of FIG. 7 in accordance with an embodiment of the present invention.

FIG. 9 is a schematic diagram of an exemplary hysteresis comparator 900 of the JTAG receiver of FIG. 7 in accordance with an embodiment of the present invention. The hysteresis comparator 706 and/or 708 of FIG. 7 may be similar to the hysteresis comparator 900 of FIG. 9. With reference to FIG. 9, the hysteresis comparator 900 may include devices N0, N1, N11, N9, N9', P3, P3', P7, P7', P8, P8', P10, P10', P12, P12', P14, P14', P15, 902, 904, 906 coupled as shown (although the hysteresis comparator 900 may include a larger or smaller number of and/or different devices, which may be coupled in a different manner). The hysteresis comparator 900 may be adapted to receive signals DC_MODE, TEST_CLK, INN, INP and Iref as input and output signal Out (although a larger or smaller amount of and/or different signals may be input by and/or output from the hysteresis comparator 900). In contrast to conventional systems, the hysteresis comparator 900 may be adapted to selectively reduce hysteresis (compared to conventional hysteresis comparators). Consequently, a degree of hysteresis level during an LSSD test may be reduced. To comply with JTAG receiver standards, the hysteresis level during a DC coupling mode may be reduced compared to that during an AC coupling mode. For example, the hysteresis level for the DC mode may be between about 20 mV to about 80 mV, while the hysteresis level for the AC mode may be between about 120 mV to about 180 mV (although a hysteresis level range for the DC and/or AC mode may be larger or smaller and/or different). Further, the hysteresis level during a digital test is set to zero to assist with the flipping of the internal nodes and to preset the comparator 900 to a known state. For example, when TEST_CLK is asserted, devices P7, P7' and P15 are all switched off. Consequently, there may be no internal feedback and thus no hysteresis in the comparator 900. By asserting DC_Mode, only devices P7, P7' are switched off, and therefore, the hysteresis level becomes stronger. During AC mode, devices P7, P7' and P15 may be switched on so that the hysteresis level is stronger still.

As further shown in FIG. 9, the hysteresis comparator 900 includes two tri-state buffers 904, 906 to feed complimentary test data (TEST_DAT and TEST_DAT_B) to internal nodes QN and QB. An additional inverter, not shown, may be employed to generate TEST_CLK_B from TEST_CLK.

In operation, RXDP and RXDN (FIG. 7) are fed into inputs INP, INN respectively, while TEST_DAT is fed to nodes QN and QP via buffers 904, 906 respectively. If TEST_CLK and DC_MODE are high, the inputs to INP and INN are disabled so that TEST_DAT drives the comparator 900. Alternatively, if TEST_CLK and DC_MODE are low, INP and INN are active so that RXDP and RXDN drive the comparator 900. The JTAG_MODE signal (FIG. 8) represents an additional enable signal.

Figure 10:
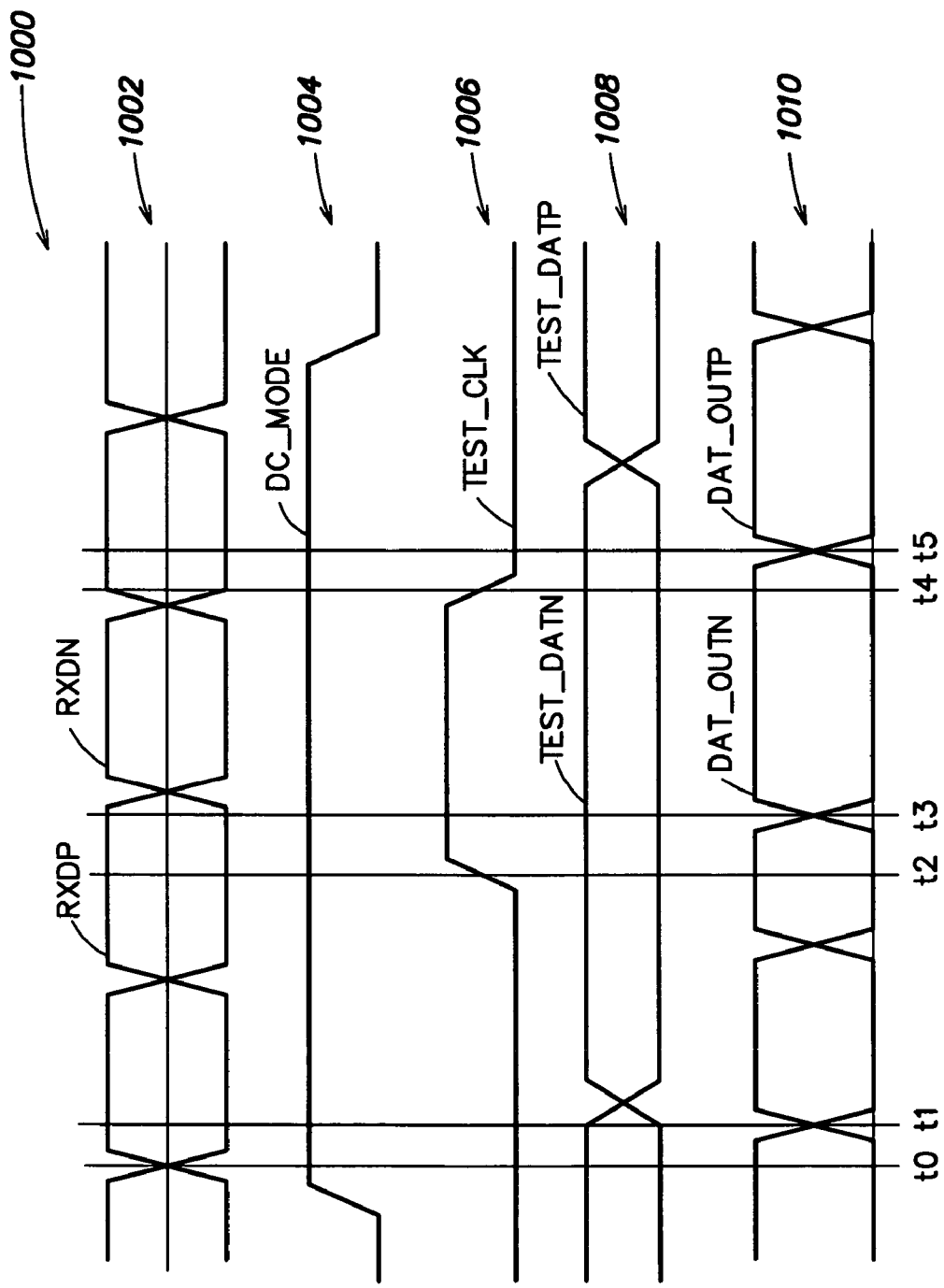
FIG. 10 is an exemplary timing diagram illustrating signals applied to the JTAG receiver of FIG. 7 in accordance with an embodiment of the present invention.

FIG. 10 is an exemplary timing diagram 1000 illustrating signals applied to the JTAG receiver 700 in accordance with an embodiment of the present invention. Such signals may be input by or output from the JTAG receiver 700 during a digital (e.g., LSSD) test. With reference to FIG. 10, data for the differential input pair RXDP, RXDN is indicated by reference numeral 1002, data for the DC_MODE signal is indicated by reference numeral 1004, data for the TEST_CLK signal is indicated by reference numeral 1006, data for the TEST_DATN, TEST_DATP signal pair is indicated by reference numeral 1008 and data for output signal pair DAT_OUTN and DAT_OUTP is indicated by reference numeral 1010.

During an LSSD test in DC mode, when TEST_CLK is high, the output DAT_OUT (e.g., DAT_OUT_N or DAT_OUT_P) of the JTAG receiver 700 may follow an input test data signal TEST_DAT (e.g., TEST_DATN or TEST_DATP). Alternatively, when TEST_CLK is low, the output DAT_OUT (e.g., DAT_OUT_N or DAT_OUT_P) of the JTAG receiver 700 may follow an input signal RXD (e.g., RXDN or RXDP) from the test driver. For example, at time t0, the differential input data RXDP, RXDN changes polarity, the DC_MODE signal is high, and the TEST_CLK signal is low. Under such conditions, the output DATA_OUTN, DAT_OUTP follows the data RXDP, RXDN input to transistors P1, P3 (FIG. 7), with a slight delay as indicated by time t1. At time t2, TEST_CLK goes high. Because DC_MODE is high, the output DATA_OUTN, DAT_OUTP begins to track the TEST_DATN, TEST_DATP signals (e.g., at time t3). At time t4, TEST_CLK goes low so that the output DATA_OUTN, DAT_OUTP again follows the data RXDP, RXDN inputs (e.g., at time t5). The timing diagram 1000 is exemplary, and therefore, a larger or smaller number of signal waveforms and/or different signal waveforms may be employed.

The foregoing description discloses only exemplary embodiments of the invention. Modifications of the above disclosed apparatus and methods which fall within the scope of the invention will be readily apparent to those of ordinary skill in the art. For instance, although a signal detector 200 and a JTAG receiver 700, each of which is adapted to behave like a logic gate during a wafer level digital test, are described above, the present invention may include other types of analog circuits which are adapted to behave like respective logic gates during a wafer level digital test.

Accordingly, while the present invention has been disclosed in connection with exemplary embodiments thereof, it should be understood that other embodiments may fall within the spirit and scope of the invention, as defined by the following claims.

The invention claimed is:

1. A method of testing an analog circuit, comprising:
providing the analog circuit with a screening circuit adapted to cause the analog circuit to function like a logic gate during a test; and
applying digital signals to the analog circuit to test the analog circuit at a wafer level so as to detect a defect in one or more components of the analog circuit.

2. The method of claim 1 further comprising testing the analog circuit using analog signals after the analog circuit is packaged into a module.

3. The method of claim 1 wherein applying digital signals to the analog circuit to test the analog circuit at a wafer level includes performing a level sensitive scan design (LSSD) test on the analog circuit at the wafer level so as to detect a defect in one or more components of the analog circuit.

4. The method of claim 1 wherein:
the analog circuit is a signal detector; and
providing the analog circuit with a screening circuit includes providing a screening circuit adapted to cause the signal detector to function like an exclusive-OR (XOR) gate.

5. The method of claim 4 wherein:
the signal detector includes a current digital-to-analog converter (IDAC); and
providing the analog circuit with a screening circuit includes providing a screening circuit adapted to cause the IDAC to function like an OR gate.

6. The method of claim 5 further comprising isolating the IDAC from a remainder of the signal detector during testing.

7. The method of claim 6 further comprising testing the signal detector and the IDAC simultaneously.

8. The method of claim 1 wherein:
the analog circuit is a Joint Test Action Group (JTAG) receiver; and
providing the analog circuit with a screening circuit includes providing a screening circuit adapted to cause the JTAG receiver to function like a multiplexer.

9. The method of claim 8 wherein the JTAG receiver includes a hysteresis comparator adapted to reduce a level of hysteresis therein while employing digital signals to test the analog circuit at the wafer level so as to detect a defect in one or more components of the analog circuit.

10. The method of claim 9 further comprising isolating inputs from the hysteresis comparator during the test and while test data is preloaded into the analog circuit.

11. An analog circuit, comprising:
a screening circuit adapted to cause the analog circuit to function like a logic gate and to allow the analog circuit to receive digital signals and to undergo testing at a wafer level so as to detect a defect in one or more components of the analog circuit.

12. The analog circuit of claim 11 wherein the analog circuit is further adapted to be tested using analog signals after the analog circuit is packaged into a module.

13. The analog circuit of claim 11 wherein the screening circuit allows the analog circuit to undergo a level sensitive scan design (LSSD) test at the wafer level so as to detect a defect in one or more components of the analog circuit.

14. The analog circuit of claim 11 wherein:
the analog circuit is a signal detector; and
the screening circuit is further adapted to cause to the signal detector to function like an exclusive-OR (XOR) gate.

15. The analog circuit of claim 14 wherein:
the signal detector includes a current digital-to-analog converter (IDAC); and
the screening circuit is further adapted to cause the IDAC to function like an OR gate.

16. The analog circuit of claim 11 wherein:
the analog circuit is a Joint Test Action Group (JTAG) receiver; and
the screening circuit is further adapted to cause the JTAG receiver to function like a multiplexer.

17. The analog circuit of claim 16 wherein the JTAG receiver includes a hysteresis comparator adapted to reduce a level of hysteresis therein while employing digital signals to test the analog circuit at the wafer level so as to detect a defect in one or more components of the analog circuit.

18. A semiconductor wafer, comprising:
an analog circuit, formed on the semiconductor wafer, having:
a screening circuit adapted to cause the analog circuit to function like a logic gate and to allow the analog circuit to receive digital signals and to undergo testing at a wafer level so as to detect a defect in one or more components of the analog circuit.

19. The semiconductor wafer of claim 18 wherein the analog circuit is adapted to:
be packaged into a module after removal from the semiconductor wafer; and
be tested using analog signals.

20. The semiconductor wafer of claim 18 wherein the screening circuit allows the analog circuit to undergo a level sensitive scan design (LSSD) test at the wafer level so as to detect a defect in one or more components of the analog circuit.

21. The semiconductor wafer of claim 18 wherein:
the analog circuit is a signal detector; and
the screening circuit is further adapted to cause to the signal detector to function like an exclusive-OR (XOR) gate.

22. The semiconductor wafer of claim 21 wherein:
the signal detector includes a current digital-to-analog converter (IDAC); and
the screening circuit is further adapted to cause the IDAC to function like an OR gate.

23. The semiconductor wafer of claim 18 wherein:
the analog circuit is a Joint Test Action Group (JTAG) receiver; and
the screening circuit is further adapted to cause the JTAG receiver to function like a multiplexer.

24. The semiconductor wafer of claim 23 wherein the JTAG receiver includes a hysteresis comparator adapted to reduce a level of hysteresis therein while employing digital signals to test the analog circuit at the wafer level so as to detect a defect in one or more components of the analog circuit.

* * * * *